(12) United States Patent
Sim

(10) Patent No.: US 6,348,815 B1
(45) Date of Patent: Feb. 19, 2002

(54) INPUT BUFFER CIRCUIT

(75) Inventor: Jae-Yoon Sim, Kyungki-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/574,273

(22) Filed: May 19, 2000

(30) Foreign Application Priority Data

May 19, 1999 (KR) .......................................... 99-18093

(51) Int. Cl.[7] .......................................... H03K 19/0948
(52) U.S. Cl. .......................... 326/86; 326/115; 326/121
(58) Field of Search .............................. 326/83, 86, 121, 326/115; 327/51–57

(56) References Cited

U.S. PATENT DOCUMENTS

| | | | |
|---|---|---|---|
| 5,736,871 A | 4/1998 | Goto | 326/115 |
| 5,834,974 A | * 11/1998 | Kim | 327/52 |
| 5,990,708 A | * 11/1999 | Hu | 327/68 |
| 5,999,020 A | 12/1999 | Volk et al. | 327/67 |
| 6,121,812 A | * 9/2000 | Tsukikawa | 327/280 |
| 6,184,744 B1 | * 2/2001 | Morishita | 327/541 |

FOREIGN PATENT DOCUMENTS

| | | |
|---|---|---|
| EP | 0729226 A2 | 8/1996 |
| JP | 08237103 | 9/1996 |
| JP | 08298445 | 11/1996 |

* cited by examiner

*Primary Examiner*—Michael Tokar
*Assistant Examiner*—Don Phu Le
(74) *Attorney, Agent, or Firm*—Skjerven Morrill MacPherson LLP; David W. Heid

(57) ABSTRACT

An input buffer circuit consumes a small amount of power and operates rapidly. The input buffer circuit includes a differential amplifier, a buffer, and a switched current path connected to the differential amplifier. The differential amplifier receives an input signal and a reference voltage and generates an internal signal from a node in the differential amplifier. The buffer generates an output signal from the internal signal. The switched current path can include a current source and/or a current sink that includes series connected transistors with gates that respectively receive the input and output signals. The switched current path is temporarily activated to provide a current that reduces charging or discharging time of the node in the amplifier. The current thus reduces the delay time between edges in the input signal and corresponding edges in the output signal. Accordingly, the input buffer circuit operates rapidly. Additionally, the current path only conducts current during a limited time so that the input buffer circuit uses power efficiently.

25 Claims, 4 Drawing Sheets

INPUT BUFFER CIRCUIT

BACKGROUND OF THE INVENTION

1. Field of the Invention

The present invention relates to a semiconductor device and more particularly, to an input buffer circuit in a semiconductor device.

2. Description of the Related Art

A clock signal typically has the highest operational frequency of any of the signals input into a semiconductor device, and the operational frequency of the clock signal increases with an increase in the operational speed of a system connected to the semiconductor device. Thus, semiconductor devices require a fast input buffer circuit to accept the clock signal.

FIG. 1 is a circuit diagram of a conventional input buffer circuit for a clock signal. Referring to FIG. 1, the conventional input buffer circuit includes a differential amplifier 11 and a buffer. The differential amplifier 11 uses a reference voltage VREF and in response to an input clock signal CLK, generates a signal OUTB having a phase that is approximately opposite to the phase of the clock signal CLK. The differential amplifier 11 outputs the signal OUTB from a node A in differential amplifier 11, to the buffer 13. The buffer 13 buffers the signal OUTB and changes the voltage level of the signal OUTB to output a CMOS-level signal DCLKB.

To operate the conventional input buffer circuit at a high frequency, a DC current through the differential amplifier 11 is increased by decreasing the resistance of a resistor R. Reducing the resistance R increases current that charges and discharges the node in the differential amplifier 11 when the input clock signal CLK changes voltage levels. However, when the DC current increases, power consumption increases. Also, the transconductance of a short-channel transistor is independent of the level of current and is proportional to the width of a channel, so that the operation speed does not increase past a certain critical point even if the resistance of the resistor R is zero.

SUMMARY OF THE INVENTION

An embodiment of the present invention provides an input buffer circuit that consumes a small amount of power and operates quickly. The input buffer circuit includes a differential amplifier, a buffer, and a switched current path (typically including a current source and/or a current sink). The differential amplifier receives an input signal and a reference voltage and outputs an internal signal having a phase approximately opposite to the phase of the input signal. The current source conducts a charging current to the differential amplifier to reduce the time required for the internal signal to transit from a logic "low" level to a logic "high" level. The current sink conducts a discharging current from the differential amplifier to reduce the time required for the internal signal to transit from the logic "high" level to the logic "low" level. In one embodiment, the input buffer circuit includes only one of the current source and the current sink in the switched current path.

In one embodiment, the differential amplifier includes a differential amplification unit for generating the internal signal in response to the input signal and the reference voltage, and a resistive device between one end of the differential amplification unit and ground.

According to one embodiment, the current source is between a power supply voltage and the node in the differential amplifier, and supplies a current to the node for a predetermined short period of time following the falling edge of the input signal. The current sink is between the differential amplification unit and ground and discharges a current from the differential amplification unit for a short period of time following the rising edge of the input signal.

According to another embodiment, the current source is between a power supply voltage and the node in the differential amplifier, and the current sink is between the node of the differential amplifier and ground. The current sink thus directly discharges a current from the node in the differential amplifier to ground for the short period of time following the rising edge of the input signal.

In the above embodiments, the current source can include first and second PMOS transistors connected in series between the power supply voltage and the output node of the differential amplifier. The output signal of the buffer is applied to the gate of the first PMOS transistor, and the input signal is applied to the gate of the second PMOS transistor.

The current sink includes first and second NMOS transistors connected in series between the differential amplifier and the ground voltage. The input signal is applied to the gate of the first NMOS transistor, and the output signal of the buffer is applied to the gate of the second NMOS transistor. The current sink can connect to an end of the differential amplifier or directly to the node in the differential amplifier.

BRIEF DESCRIPTION OF THE DRAWINGS

The features and advantages of the present invention will become more apparent by describing in detail exemplary embodiments thereof with reference to the attached drawings in which.

Use of the same reference symbols in different figures indicates similar or identical items.

DESCRIPTION OF THE PREFERRED EMBODIMENTS

Hereinafter, embodiments of the present invention will be described in detail with reference to the attached drawings. However, these embodiments of the present invention can be modified into various other forms, and the scope of the present invention is not restricted to the embodiments disclosed.

Figure 2:
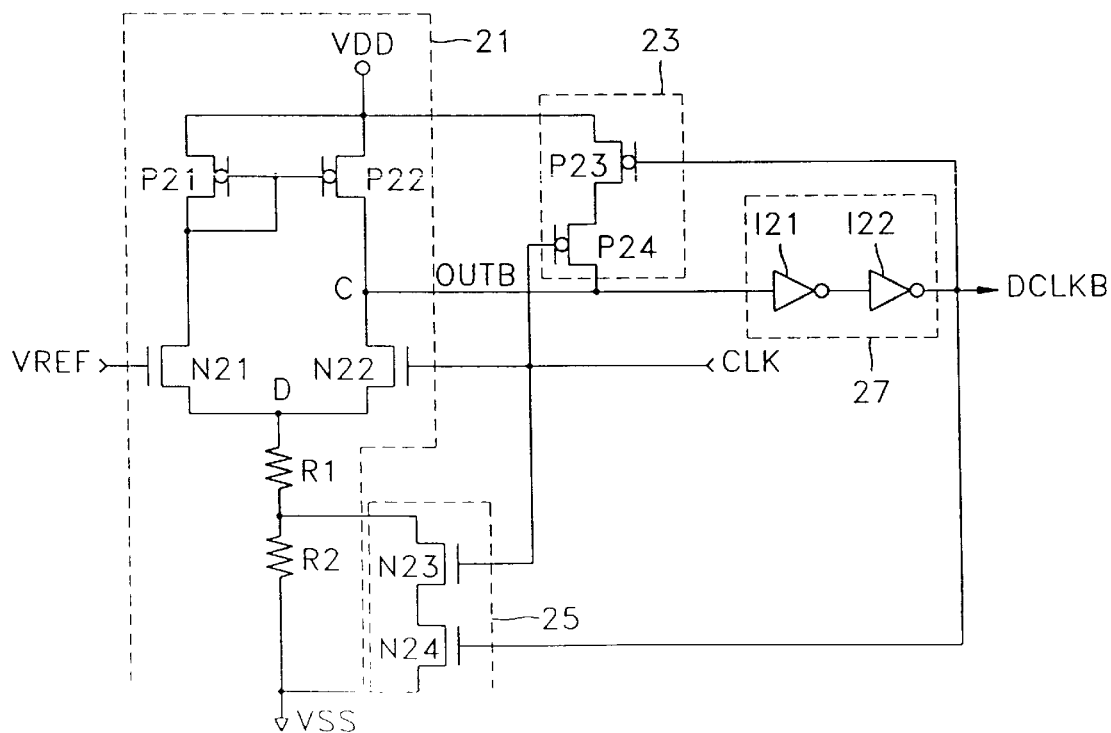
FIG. 2 is a circuit diagram of an input buffer circuit according to an embodiment of the present invention.

FIG. 2 is a circuit diagram of an input buffer circuit according to an embodiment of the present invention. The input buffer circuit includes a differential amplifier 21 and a buffer 27. The input buffer circuit also includes a current source 23 that reduces the rise time of the signal OUTB output from the differential amplifier 21. More particularly, the current source 23 reduces the time taken for a transition of the signal OUTB from a logic "low" level to a logic "high" level. A current sink 25 reduces the fall time of the signal OUTB, that is, the time taken for a transition from the logic "high" level to the logic "low" level.

In the embodiment of FIG. 2, the input buffer circuit includes both the current source 23 and the current sink 25. An alternative embodiment includes only the current source 23 or the current sink 25.

The differential amplifier 21 receives a reference voltage VREF and the input clock signal CLK and outputs the signal OUTB from a node C. The differential amplifier 21 is a typical differential amplifier or a differential amplification unit. In the embodiment of FIG. 2, the differential amplifier 21 includes PMOS transistors P21 and P22, NMOS transistors N21 and N22, and resistors R1 and R2 acting as a resistive element.

A power supply voltage VDD is applied to the source of the PMOS transistor P21, which has a gate and drain connected together. The power supply voltage VDD is also applied to the source of the PMOS transistor P22, which has a gate connected to the gate of the PMOS transistor P21. The drain of the PMOS transistor P22 is connected to the node C.

The drain of the NMOS transistor N21 is connected to the drain of the PMOS transistor P21, and the reference voltage VREF is applied to the gate of the NMOS transistor N21. The drain of the NMOS transistor N22 is connected to the node C, and the clock signal CLK is applied to the gate of the NMOS transistor N22. The sources of the NMOS transistors N21 and N22 are both connected to a node D. The resistors R1 and R2 are connected in series between the node D and a ground voltage VSS.

The NMOS transistor N22 and the resistors R1 and R2 pull down the signal OUTB when the input signal CLK is at a voltage above the reference voltage VREF. The PMOS transistor P22 pulls up the signal OUTB when the input signal CLK is at a voltage below the reference voltage VREF. The reference voltage VREF and the relative sizes of transistors P21, P22, N21, and N22 and resistors R1 and R2 can be selected according to the desired trip point and amplification of the differential amplifier 21 using known circuit design techniques. Alternatively, the differential amplifier 21 can have various configurations, which are known to those skilled in the art.

The buffer 27 delays and buffers the signal OUTB output from the differential amplifier 21 and thereby generates a CMOS-level output clock signal DCLKB. In the embodiment of FIG. 2, the buffer 27 includes two inverters I21 and I22, which are connected in series, but the buffer 27 alternatively can include other logic gates including, for example, a Schmitt trigger logic gate.

As described above, the current source 23 reduces the time required for the transition of the signal OUTB from the logic "low" level to the logic "high" level. More particularly, the current source 23 temporarily supplies a current to the node C in the differential amplifier 21 in response to the input clock signal CLK and the output signal DCLKB. The current source 23 includes first and second PMOS transistors P23 and P24, which are connected in series between the power supply voltage VDD and the node C. The gate of the first PMOS transistor P23 receives the output signal DCLKB, and the gate of the second PMOS transistor P24 receives the input clock signal CLK.

The current sink 25 reduces the time required for the transition of the signal OUTB from the logic "high" level to the logic "low" level. In particular, the current sink 25 temporarily discharges a current from the node D in response to the input clock signal CLK and the output signal DCLKB. The current sink 25 includes first and second NMOS transistors N23 and N24, which are connected in series between the node D and the ground voltage VSS. The gate of the first NMOS transistor N23 receives the input clock signal CLK, and the gate of the second NMOS transistor N24 receives the output signal DCLKB of the buffer 27. In the embodiment of FIG. 2, the current sink 25 is between the junction of the resistors R1 and R2 and the ground voltage VSS. Alternative connections can also discharge current from the node D and are in accordance with the invention.

Figure 3:
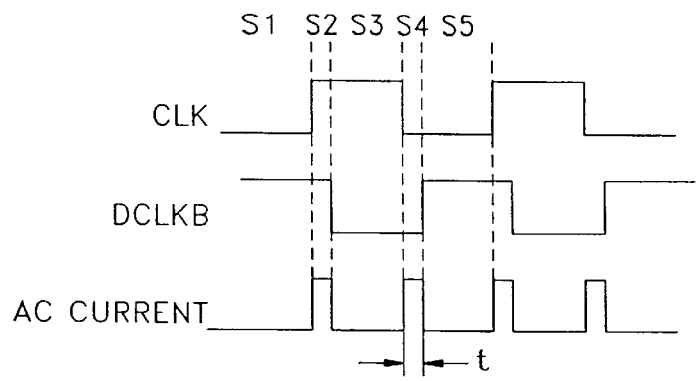
FIG. 3 is a timing diagram illustrating the operation of the input buffer circuit of FIG. 2.

FIG. 3 is a timing diagram illustrating the operation of the input buffer circuit of FIG. 2. As shown in FIG. 3, the phase of the clock signal CLK is nearly opposite to that of the output signal DCLKB of the buffer, and a delay time t corresponds to a phase difference between the signal CLK and the complement of the signal DCLKB.

During an initial time interval Si shown in FIG. 3, the input clock signal CLK is in the logic "low" state, and the output signal DCLKB of the buffer 27 is in the logic "high" state. The logic "high" state of the output signal DCLKB turns on the second NMOS transistor N24 of the current sink 25, but the logic "low" state of the clock signal CLK turns off the first NMOS transistor N23 of the current sink 25. Accordingly, no current flows through the current sink during the interval S1. Also during the interval S1, the clock signal CLK turns on the second PMOS transistor P24, but the output signal DCLKB turns off the first PMOS transistor P23 so that no current flows through the current source 23. That is, during the interval S1, no current flows via the current source 23 or the current sink 25.

A time interval S2 extends from the rising edge of the clock signal CLK, when the clock signal CLK transitions from the logic "low" level to the logic "high" level until the falling edge of the output signal DCLKB, when the output signal DCLKB transitions from the logic "high" level to the logic "low" level. The logic "high" levels of the clock signal CLK and the output signal DCLKB respectively turn on the NMOS transistors N23 and N24 of the current sink 25, and a current flows through the current sink 25. Accordingly, the current sink 25 discharges the node D of the differential amplifier 21 to the ground VSS during the interval S2. In response, the voltage level of the node C of the differential amplifier 21 quickly falls, which reduces the time required for the transition of the signal OUTB from the logic "high" level to the logic "low" level. While the signals CLK and DCLKB are at the logic "high" level, the first and second PMOS transistors P23 and P24 of the current source 23 are off, so that no current flows through the current source 23. The fast drop in the signal OUTB makes the delay t between the rising edge of the clock signal CLK and the falling edge of the output signal DCLKB approximately equal to the delay time of the buffer 27.

A time interval S3 extends from the falling edge of the output signal DCLKB and the falling edge of the clock signal CLK. Accordingly, during the interval S3, the output signal DCLKB is at the logic "low" level and turns off the second NMOS transistor N24 of the current sink 25. Again, no current flows through the current sink 25 during the interval S3. Also, during the interval S3, the clock signal CLK is at the logic "high" level and turns off the second PMOS transistor P24 of the current source 23, so that no current flows through the current source 23. Accordingly, no current flows through the current sink 25 or the current source 23 during the interval S3.

A time interval S4 extends from the falling edge of the clock signal CLK until the next rising edge of the output signal DCLKB. During the time interval S4, the clock signal CLK and the output signal DCLKB respectively turn on the PMOS transistors P24 and P23 of the current source 23, so that a current flows through the current source 23. Accordingly, the current source 23 supplies a current from the power supply voltage VDD to the node C of the differential amplifier 21. The current through the current source 23 quickly increases the voltage level of the node C of the differential amplifier 21, and the current source 23 thereby reduces the time required for the signal OUTB to transition from the logic "low" level to the logic "high" level. Accordingly, the delay between the falling edge of the clock signal CLK and the rising edge of the output signal DCLKB is approximately equal to the delay time of the buffer 27.

A time interval S5 extends from the rising edge of the output signal DCLKB until the next rising edge of the clock signal CLK. During the time interval S5, the signals CLK and DCLKB are at the same levels as in the initial interval S1. In particular, the output signal DCLKB of the buffer is at a logic "high" level and turns off the first PMOS transistor P23 of the current source 23. Thus, no current flows through the current source 23 during the time interval S5. Also, the clock signal CLK is at the logic "low" level and turns off the first NMOS transistor N23 of the current sink 25, so that no current flows through the current sink 25. Accordingly, no current flows through the current sink 25 or the current source 23 during the time interval S5.

Consequently, the input buffer circuit of FIG. 2 uses the current sink 25 to quickly discharge the node D of the differential amplifier 21 to the ground voltage VSS. Thus, the high-to-low transition time of the signal OUTB is reduced. Further, during each period of the clock signal CLK, the current sink 25 only draws current during the short time interval S2 between the rising edge of the clock signal CLK and falling edge of the output signal DCLKB. Similarly, the current source 23 quickly supplies current from the power supply voltage VDD to the node C of the differential amplifier 21 to reduce the low-to-high transition time of the signal OUTB. During each period of the clock signal CLK, the current source 23 only supplies current during the short time interval S4 between the falling edge of the clock signal CLK and the rising edge of the output signal DCLKB. Thus, the current source 23 uses only a relatively small amount of power to increase the transition speed and the response time of the input buffer circuit of FIG. 2.

Figure 4:
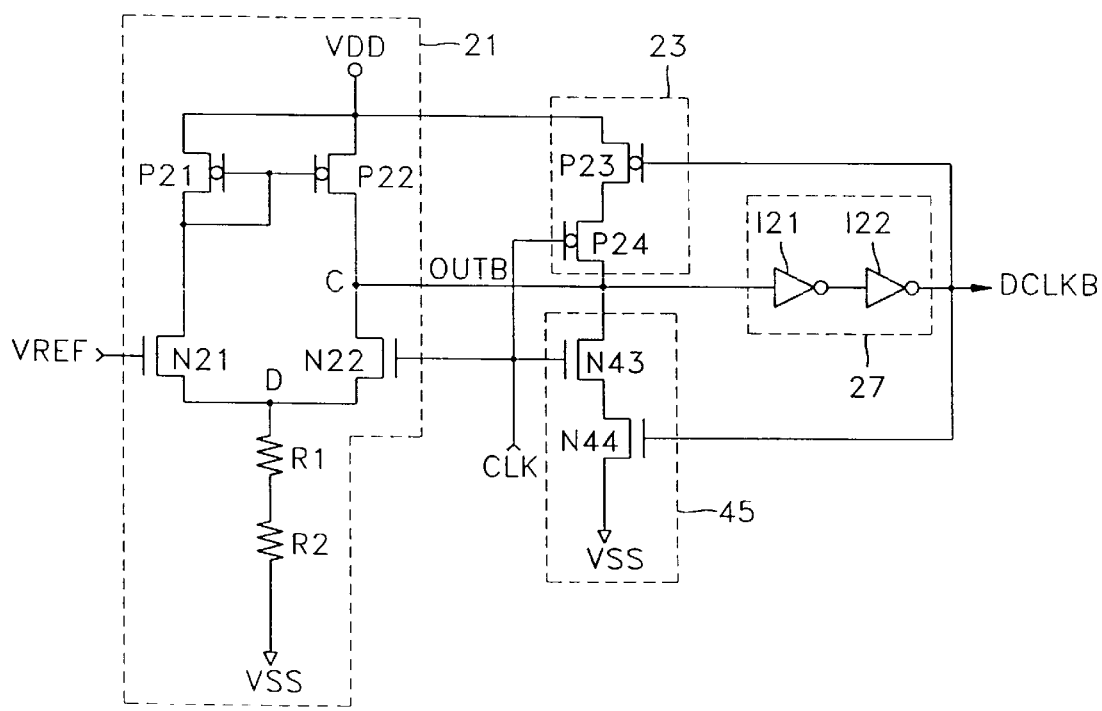
FIG. 4 is a circuit diagram of an input buffer circuit according to another embodiment of the present invention.

FIG. 4 is a circuit diagram of an input buffer circuit according to another embodiment of the present invention. The constituents of the input buffer circuit of FIG. 4 are the same as those of the input buffer circuit of FIG. 2, except for the connection of a current sink 45. In the input buffer circuit of FIG. 4, the current sink 45 connects to the node C in the differential amplifier 21. FIG. 4, like FIG. 2, shows an input buffer circuit that includes both a current source 23 and a current sink 45. Alternatively, only one of them is included.

The operation of the input buffer circuit of FIG. 4 is the same as that of the input buffer circuit of FIG. 2, except that the current sink 45 directly discharges a current from the node C in the differential amplifier 21 to the ground voltage VSS. Thus, the operation of the input buffer circuit of FIG. 4 is not further described here.

The current source and the current sink can be adopted in a general input buffer and an internal circuit that operate at high speed, and in the differential amplification input buffer such as shown in FIGS. 2 and 4.

Figure 1:
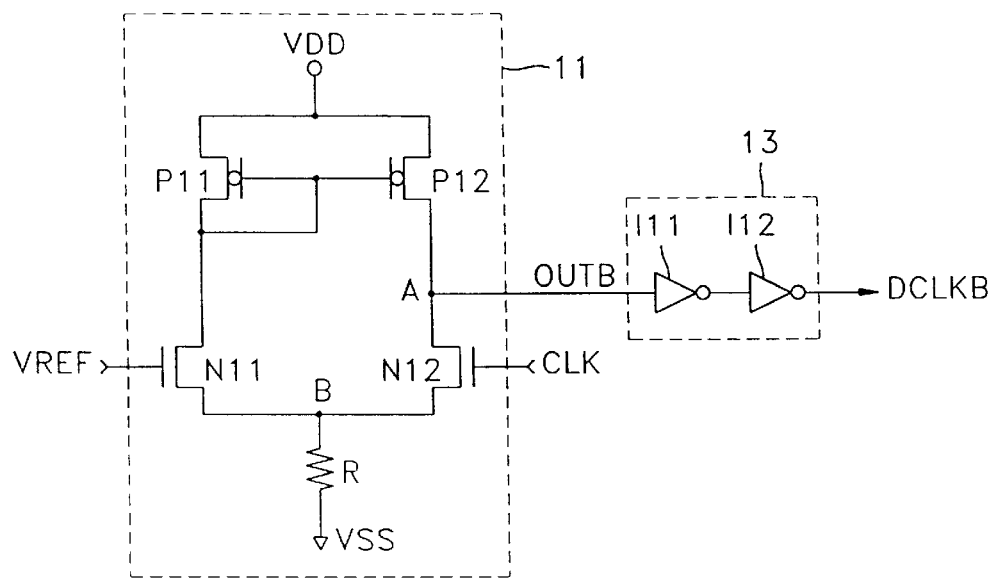
FIG. 1 is a circuit diagram of a conventional input buffer circuit that accepts a clock signal.
Figure 5A:
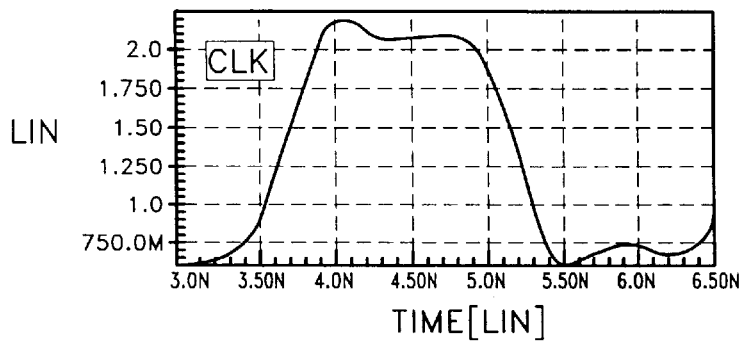
FIGS. 5A, 5B, and 5C show waveforms illustrating comparisons of simulations of the conventional input buffer circuit of FIG. 1 and the input buffer circuit of FIG. 2.
Figure 5B:
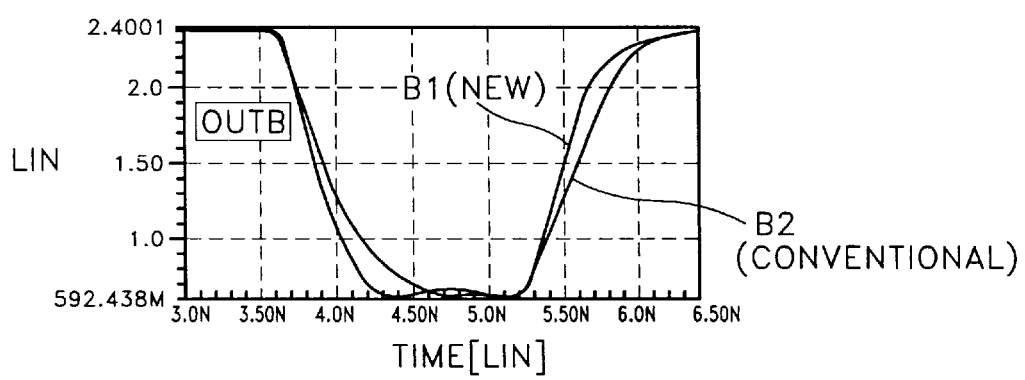
Figure 5C:
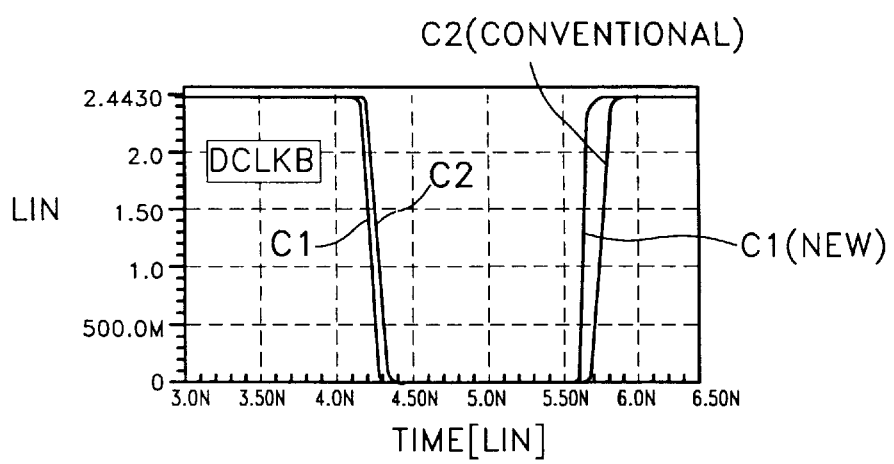

FIGS. 5A through 5C are graphs of waveforms illustrating the results of simulations of the conventional input buffer circuit of FIG. 1 and the input buffer circuit of FIG. 2. FIG. 5A shows a clock signal CLK as input to either buffer circuit, FIG. 5B shows the signals OUTB output from the differential amplifiers 11 and 21, and FIG. 5C shows the output signals DCLKB of the buffers 13 and 27.

The simulation conditions were: a power supply voltage VDD of 2.4V, a reference voltage VREF of 1.4V, a resistance R1 of 1.5KΩ, a resistance R2 of 3.5KΩ, and a level of the clock signal CLK ranging from 0.7 to 2.1V. Also, the channel lengths of the NMOS transistors N21 through N24 were 0.7μm, the channel length of the PMOS transistors P21 through P24 were 0.8μm, and the width of the channel of each transistor is shown in Table 1.

TABLE 1

| Transistor | Width of channel (μm) | Transistor | Width of channel (μm) |
|---|---|---|---|
| N21 | 12 | P21 | 4 |
| N22 | 18 | P22 | 6 |
| N23 | 3 | P23 | 6 |
| N24 | 3 | P24 | 6 |

In FIG. 5B, the curve B1 represents the signal OUTB from the differential amplifier 21 of FIG. 2, and the curve B2 represents the signal OUTB from the differential amplifier 11 of FIG. 1. Comparison of curves B1 and B2 shows that the time during which the signal OUTB transitions from the logic "high" level to the logic "low" level is faster in the curve B1 than in curve B2. Similarly, the time during which the signal OUTB transitions from the logic "low" level to the logic "high" level is faster in the curve B1 than in the curve B2.

In FIG. 5C, a curve C1 represents the output signal DCLKB from the buffer 27 of FIG. 2, and the curve C2 represents the output signal DCLKB from the buffer 13 of FIG. 1. Referring to FIG. 5C, the curves C1 and C2 show that the output signal DCLKB from the buffer 27 falls and rises more rapidly than the output signal DCLKB from the buffer 13. Accordingly, the input buffer circuit according of FIG. 2 operates faster than the conventional input buffer circuit of FIG. 1.

Figure 6:
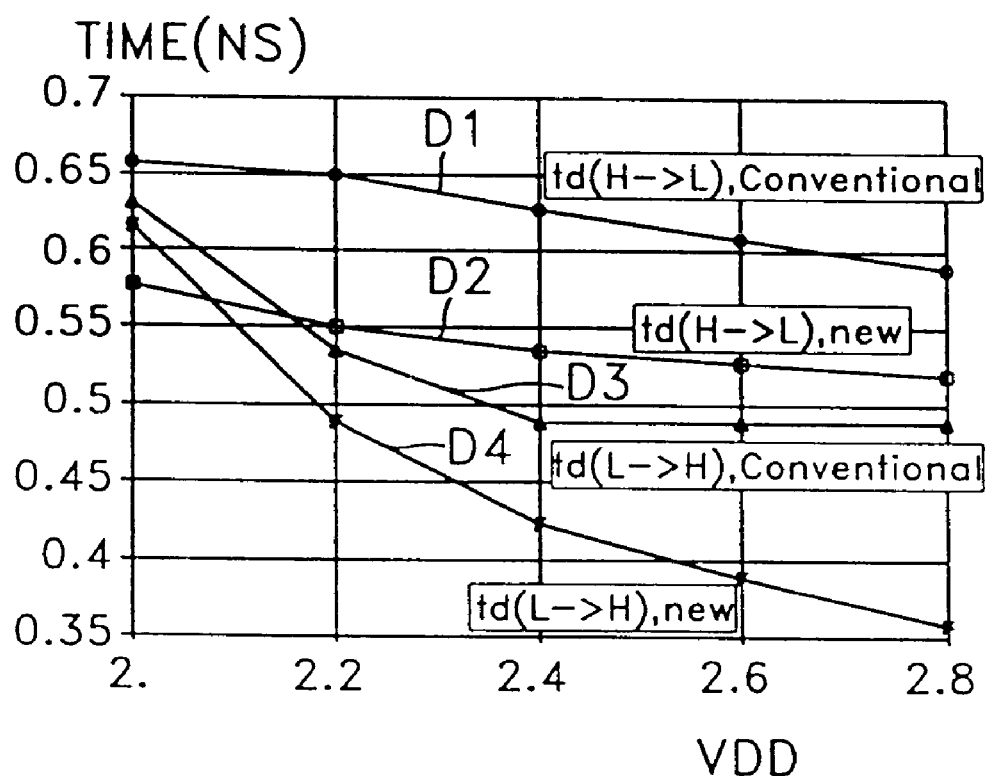
FIG. 6 is a graph showing delay times versus the power supply voltage VDD in the conventional input buffer circuit of FIG. 1 and the input buffer circuit of FIG. 2.

FIG. 6 contains graphs illustrating the dependence of time delays on the power supply voltage VDD. A graph D1 denotes the time interval from the rising edge of the clock signal CLK to the falling edge of the output signal DCLKB in the conventional input buffer circuit of FIG. 1. A graph D2 denotes the time interval from the rising edge of the clock signal CLK to the falling edge of the output signal DCLKB in the input buffer circuit of FIG. 2. A graph D3 denotes the time interval from the falling edge of the clock signal CLK to the rising edge of the output signal DCLKB in the conventional input buffer circuit of FIG. 1. A graph D4 denotes the time interval from the falling edge of the clock signal CLK to the rising edge of the output signal DCLKB in the input buffer circuit of FIG. 2. Referring to FIG. 6, the time delay of the input buffer circuit of FIG. 2 is short compared to the conventional input buffer circuit of FIG. 1.

As described above, input buffer circuits according to embodiments of the present invention employ switched current paths including current sources and/or current sinks that only operate for a limited time. More particularly, a current sink quickly discharges a node to the ground voltage VSS during a short time following the rising edge of the clock signal CLK, and thereby reduces the time required for the node to transit from the logic "high" level to the logic "low" level. A current source supplies a current from the power supply voltage VDD during a short time following the falling edge of the clock signal CLK and thereby reduces the time required for the node to transit from the logic "low" level to the logic "high" level. Accordingly, the input buffer circuits according to embodiments of the present invention have higher operating speeds. Also, since the current sink and the current source do not continuously conduct current, the input buffer circuits according to embodiments of the present invention consume less power when compared to a conventional input buffer circuit, having the same operation speed.

Although the invention has been described with reference to a particular embodiment, it will be apparent to one of ordinary skill in the art that modifications of the described embodiment may be made without departing from the spirit and scope of the invention.

What is claimed is:

1. An unput buffer circuit comprising:
   a differential amplifier that receives an input signal and reference voltage and outputs an internal signal from a node in the differential amplifier;
   buffer coupled to the node in the deferential amplifier, wherein the buffer generates an output signal from the internal output from the differential amplifier; and
   a current source that supplies a current to the node in the differential amplifier in response to the input signal and the output signal of the buffer;
   wherein the input signal is applied to the current source.

2. The input buffer circuit of claim 1, further comprising a current sink that discharges a current from the differential amplifier in response to the input signal and the output signal of the buffer.

3. The input buffer circuit of claim 2, wherein the current sink comprises first and second NMOS transistors connected in series between the differential amplifier and a ground voltage, wherein the input signal is applied to the gate of the first NMOS transistor, and the output signal of the buffer is applied to the gate of the second NMOS transistor.

4. The input buffer circuit of claim 1, wherein the current source comprises first and second PMOS transistors connected in series between a power supply voltage and the node in the differential amplifier, wherein the output signal of the buffer is applied to the gate of the first PMOS transistor, and the input signal is applied to the gate of the second PMOS transistor.

5. The input buffer circuit of claim 1, wherein the output signal of the buffer is applied to the current source.

6. An input buffer circuit comprising:
   a differential amplifier that receives an input signal and a reference voltage and outputs an internal signal from a node in the differential amplifier;
   a buffer coupled to the node in the differential amplifier, wherein the buffer generates an output signal from the internal signal output from the differential amplifier;
   a current source that supplies a current to the node in the differential amplifier in response to the input signal and the output signal of the buffer; and
   a current sink that discharges a current from the node in the differential amplifier in response to the input signal and the output signal.

7. The input buffer circuit of claim 6, wherein the current sink comprises first and second NMOS transistors connected in series between the node in the differential amplifier and a ground voltage, wherein the input signal is applied to the gate of the first NMOS transistor, and the output signal of the buffer is applied to the gate of the second NMOS transistor.

8. An input buffer circuit comprising:
   a differential amplifier that receives an input signal and a reference voltage and outputs an internal signal from a node in the differential amplifier;
   a buffer coupled to the node in the differential amplifier, wherein the buffer generates an output signal from the internal signal output from the differential amplifier; and
   a current sink that discharges a current from the differential amplifier in response to the input signal and the output signal of the buffer;
   wherein the output signal of the buffer is applied to the current sink.

9. The input buffer circuit of claim 8, further comprising a current source that supplies a current to the node in the differential amplifier in response to the input signal and the output signal of the buffer.

10. The input buffer circuit of claim 8, wherein the current sink comprises first and second NMOS transistors connected in series between the differential amplifier and a ground voltage, wherein the input signal is applied to the gate of the first NMOS transistor, and the output signal of the buffer is applied to the gate of the second NMOS transistor.

11. The input buffer circuit of claim wherein the current source comprises first and second PMOS transistors connected in series between a power supply voltage and the node in the differential amplifier, wherein the output signal of the buffer is applied to the gate of the first PMOS transistor, and the input signal is applied to the gate of the second PMOS transistor.

12. The input buffer circuit of claim 8, wherein the input signal is applied to the current sink.

13. An input buffer circuit comprising:
   a differential amplifier that receives an input signal and a reference voltage and generates an internal signal from a node in the differential amplifier;
   a buffer coupled to the node in the differential amplifier, wherein the buffer generates an output signal from the internal signal; and
   a current sink that discharges a current from the node in the differential amplifier in response to the input signal and the output signal of the buffer.

14. The input buffer circuit of claim 13, wherein the current sink comprises first and second NMOS transistors connected to each other in series between the node in the differential amplifier and a ground voltage, wherein the input signal is applied to the gate of the first NMOS transistor, and the output signal of the buffer is applied to the gate of the second NMOS transistor.

15. The input buffer circuit of claim 13, further comprising a current source that supplies a current to the node in the differential amplifier in response to the input signal and the output signal of the buffer.

16. The input buffer circuit of claim 15, wherein the current source comprises first and second PMOS transistors connected in series between a power supply voltage and the node in the differential amplifier, wherein the output signal of the buffer is applied to the gate of the first PMOS transistor, and the input signal is applied to the gate of the second PMOS transistor.

17. An input buffer circuit comprising:
   a differential amplifier that receives an input signal and generates an internal signal from a node in the differential amplifier;

a buffer coupled to the node in the differential amplifier, the buffer generating an output signal from the internal signal; and a switched current path coupled to the node of the differential amplifier, wherein the switched current path conducts a current only during an interval following an edge in the input signal;

wherein the output signal of the buffer is applied to the switched current path.

18. The input buffer circuit of claim 17, wherein the switched current path comprises first and second transistors connected in series between the node in the differential amplifier and a supply voltage, the first transistor having a gate that receives the input signal, the second transistor having a gate that receives the output signal.

19. The input buffer circuit of claim 17, wherein the current path comprises first and second transistors connected in series between the node in the differential amplifier and a ground voltage, the first transistor having a gate that receives the input signal, the second transistor having a gate that receives the output signal.

20. The input buffer circuit of claim 17 wherein the input signal is applied to the switched current path.

21. An input buffer circuit comprising:

a differential amplifier that receives an input signal and a reference voltage and outputs an internal signal from a node in the differential amplifier;

a buffer coupled to the node in the differential amplifier, wherein the buffer generates an output signal from the internal signal output from the differential amplifier;

a first current sink that discharges a current from the differential amplifier; and a second current sink that discharges a current from the differential amplifier in response to the input signal and the output signal.

22. The input buffer circuit of claim 21, further comprising a current source that supplies a current to the node in the differential amplifier in response to the input signal and the output signal of the buffer.

23. The input buffer circuit of claim 22, wherein the current source comprises first and second PMOS transistors connected in series between a power supply voltage and the node in the differential amplifier, wherein the output signal of the buffer is applied to the gate of the first PMOS transistor, and the input signal is applied to the gate of the second PMOS transistor.

24. The input buffer circuit of claim 21, wherein the second current sink comprises first and second NMOS transistors connected in series between the differential amplifier and a ground voltage, wherein the input signal is applied to the gate of the first NMOS transistor, and the output signal of the buffer is applied to the gate of the second NMOS transistor.

25. The input buffer circuit of claim 21, wherein the second current sink discharges current from the node in the differential amplifier.

* * * * *